United States Patent [19]

Wilhelm et al.

[11] Patent Number: 4,601,049
[45] Date of Patent: Jul. 15, 1986

[54] INTEGRABLE SEMICONDUCTOR CIRCUIT FOR A FREQUENCY DIVIDER

[75] Inventors: Wilhelm Wilhelm; Zafer Incecik, both of Munich, Fed. Rep. of Germany

[73] Assignee: Siemens Aktiengesellschaft, Berlin & Munich, Fed. Rep. of Germany

[21] Appl. No.: 675,273

[22] Filed: Nov. 27, 1984

[30] Foreign Application Priority Data

Dec. 1, 1983 [DE] Fed. Rep. of Germany ....... 3343573

[51] Int. Cl.[4] .................. H03K 23/00; H03K 21/00
[52] U.S. Cl. ..................................... 377/115; 377/120; 307/272 A; 307/292
[58] Field of Search .............................. 377/115, 120; 307/272 A, 292

[56] References Cited

U.S. PATENT DOCUMENTS 3,728,561  4/1973  Brocker ................... 377/115
3,818,250  6/1974  Reed et al. ............... 377/115

OTHER PUBLICATIONS

"Frequenzteiler für Ultrahohe Frequenzen" (Frequency Divider for Ultrahigh Frequencies), Kasperkovitz, Philips tech. Rdsch. 38, pp. 47-62, 1979.

Primary Examiner—John S. Heyman
Attorney, Agent, or Firm—Hill, Van Santen, Steadman & Simpson

[57] ABSTRACT

An integrable semiconductor circuit for a multi-stage frequency divider having a number of master-slave flip-flop cells constructed in current mode logic forming the individual divider stages which are connected in series to a supply voltage and which are accordingly at different levels of the supply voltage has an input stage to which an input signal at an input frequency, and the inverse thereof, are supplied. The input stage is in the form of a differential amplifier having two identical transistors which are connected to a constant current source. The differential amplifier forms the first divider stage, that is, the first master-slave flip-flop, in combination with a first network including a number of transistors and load resistors. The further divided stages do not require an input circuit, therefore each subsequent stage includes only a network corresponding to the network of the first stage. The outputs of the slave portion of the first network respectively control one of the two inputs of the second network (second divider stage) and so on for each subsequent divider stage. The outputs of the master portion are connected through respective load resistors through respective paths leading to the supply voltage external of the networks. The voltage drop of each path is matched to the voltage drop within the chain of networks leading to the supply voltage.

8 Claims, 7 Drawing Figures

INTEGRABLE SEMICONDUCTOR CIRCUIT FOR A FREQUENCY DIVIDER

BACKGROUND OF THE INVENTION

1. Field of the Invention

The present invention relates to integrable semiconductor circuits for use as a frequency divider or a binary counter.

2. Description of the Prior Art

A frequency divider (or asynchronous pulse counters) are described in "Philips techn. Rdsch.", 38, No. 2, 1979 at pages 47–62 which are constructed utilizing bistable circuits (flip-flop elements or cells) functioning according to the master-slave principle. Such conventional circuits utilize transistors of the same type connected to load resistors to form a network. A signal sequence consisting of a series of identical pulses to be processed is supplied to the inputs of an input stage which is formed by a differential amplifier. The differential amplifier consists of two transistors having respective current input electrodes which are connected to each other and to a grounded terminal through a constant current source. The current output electrodes of the transistors comprising the differential amplifier are connected to a supply voltage terminal through the aforementioned network. The network forms a bistable circuit in combination with the input circuit, this bistable circuit functioning according to the master-slave principle and having two outputs at which output pulses are tapped.

Known circuits of the type described above are generally manufactured using bipolar transistors, particularly of the NPN type. It is also possible, however, to construct such circuits using field effect transistors, particularly self-inhibiting metal-oxide-semiconductor field effect transistors. As used herein, the term "current input electrode" when used in connection with bipolar transistors means the emitter terminal, the term "current output electrode" means the collector terminal, and the term "control electrode" means the base terminal. For field effect transistors, the term "current input electrode" means the source terminal, the term "current output electrode" means the drain terminal, and the term "control electrode" means the gate terminal.

Conventional frequency divider circuits (or digital counter circuits) of the type described above including a plurality of divider or counter stages exhibit a dynamic behavior which places different demands upon the different stages. Whereas the first stage must process the input frequency, that is, the highest frequency, the second stage receives only half of that frequency, and in general the $p^{th}$ stage generally only receives $1/(2^{p-1})$ of the input frequency.

It has been generally recognized that the occurrence of increasingly reduced dynamic demands along the chain of divider or counter stages permits staggering the current division to the individual stages in order to reduce the overall power dissipation of the flip-flop chain forming the divider or counter circuit. For example, the current supplied to each individual stage in the chain may be one-half of the current supplied to the immediately preceding stage in order to meet a desired power dissipation/transit time product which is fixed by the particular technology which is utilized to manufacture the circuit.

SUMMARY OF THE INVENTION

It is an object of the present invention to provide a frequency divider or counter circuit of the type described above which further reduces power dissipation. The above object is inventively achieved in a semiconductor circuit having a plurality of transistor and load resistor networks which are identical except for respectively different load resistor weightings. Each stage has two inputs and functions as a master-slave flip-flop cell. The inputs of the first stage are connected to an input stage to which the input signal (or input frequency) is supplied, and the inputs of all subsequent stages are respectively connected to the weighted load resistors of the outputs of the slave portion of the immediately preceding network. The two outputs of the master portion of each network are connected to a further circuit element which exhibits a voltage drop equal to the voltage drop through the next-following network. The weighted load resistors of the last network are all connected to the supply voltage, and the further circuit elements are all connected in series to the supply voltage as well.

In contrast to known circuits as described earlier, the networks in the frequency divider or counter chain constructed in accordance with the principles of the present invention representing the individual stages are respectively connected in series to at least two levels of potential, similar to series-gated CML gates. This construction has the advantage that the current for all stages following the first stage (which may be, for example, supplied with a supply voltage of 5 V) is taken from the first stage, rather than from the supply voltage source, resulting in a halving of the total power dissipation. A further advantage is that no potential level shifting means is required between subsequent stages, as is required by conventional circuits, this resulting in a halving of the level shifter power which is normally consumed by conventional circuits, because such power is consumed only in the first stage. Another advantage is a significant reduction in the outlay for components, that is, for transistors and resistors, due to the elimination of level shifters.

DESCRIPTION OF THE PREFERRED EMBODIMENTS

All transistors shown in the accompanying drawings discussed below are bipolar NPN transistors, however, it will be apparent to those skilled in the art that other transistor types, for example, PNP bipolar transistors or MOS field effect transistors may be employed without departing from the inventive concept disclosed and claimed herein.

Figure 1:
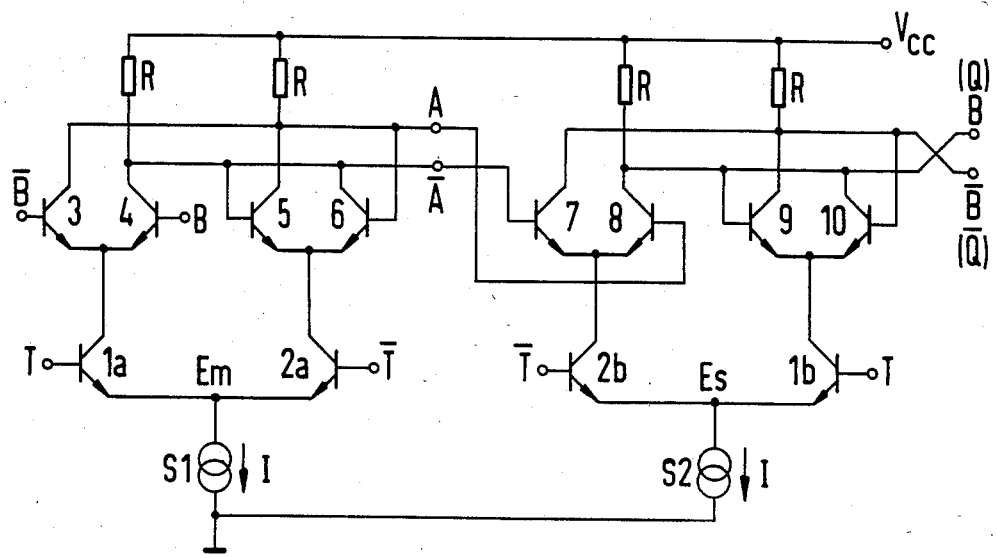
FIG. 1 is a circuit diagram of a known divider (or counter) stage having two input stages.

The circuit shown in FIG. 1 is an example of a singlestage frequency divider realized in current mode logic (CML) technology of the type described earlier, that is, a standard master-slave RS flip-flop. The circuit has two input stages Em and Es in the form of respective differential amplifiers, each of which is supplied with pulse sequences T and $\overline{T}$ ($\overline{T}$ being the inversion of T). The input stage Em is for the master flip-flop portion, an the input stage Es is for the slave flip-flop portion. The differential amplifier Em consists of two transistors 1a and 2a having respective emitters which are connected to each other and to the reference potential $V_{ss}$ (ground terminal) through a constant current source S1, and are thereby supplied with a current I. The input stage es allocated to the slave portion consists of two transistors 1b and 2b having respective emitters connected to each other and to a current source S2, identical to the current source S1. The respective control electrodes of the transistors 1a and 1b are controlled by the clock sequence T, and the respective control electrodes of the transistors 2a and 2b are controlled by the clock sequence $\overline{T}$. The two constant current sources S1 and S2 are designed in the standard manner, for example, as output transistors of a symmetrical current source. The two current sources S1 and S2 may each be a transistor of the same type as the transistor employed in the input stage connected thereto, and may be controlled in common by a symmetric current input switched as a diode.

The two clock sequences T and $\overline{T}$ controlling the two input stages Em and Es represent the frequency to be divided (or the pulses to be counted) which can be made available by means of a frequency generator, for example a rectangular pulse generator having a non-inverting output and an inverting output.

The circuit shown in FIG. 1 for a CML master-slave flip-flop cell thus has input stages Em and Es identical to each other.

The collector of the transistor 1a controlled by the clock sequence T functions as a current switch and is connected to the emitters of two further transistors 3 and 4 in the master portion of the flip-flop, the further transistors 3 and 4 also forming a differential amplifier. The other transistor 2a of the input stage Em, controlled by the inverted clock sequence $\overline{T}$, has a collector connected to the emitters of two further transistors 5 and 6, which also form a differential amplifier. The transistors of the two further additional amplifiers which are current-controlled by the input stage Em have respective collectors which are cross-connected to form a collector pair, that is, the collector of one transistor in one of the differential amplifiers is connected to the collector of one transistor in the other differential amplifier in the master portion. Each collector pair is connected through a respective load resistor R to the supply voltage $V_{cc}$. In the example shown in FIG. 1, the collectors for transistors 3 and 5 are connected through a load resistor R to the supply voltage $V_{cc}$, and the collectors for transistors 4 and 6 are similarly connected through another load resistor R to the supply potential $V_{cc}$. Additionally, the base terminal for the differential amplifier which is controlled by the inverted clock sequence $\overline{T}$ are respectively connected to the two collector pairs, the base terminal for the transistor 5 being connected to the collectors for transistors 4 and 6, and the base terminal for the transistor 6 being connected to the collectors for the transistors 3 and 5. The transistors 5 and 6 in combination thus form an RS flip-flop.

The transistors for the differential amplifier controlled by the non-inverted clock sequence T (transistors 3 and 4) are supplied at their respective bases with the two outputs B and $\overline{B}$ of the slave flip-flop, transistor 3 being controlled by the inverted output $\overline{B}$ and transistor 4 being controlled by the non-inverted output B. The nodes at which the outputs of the differential amplifiers (that is, the collector pairs) are connected to the respective load resistors form the outputs of the master flip-flop, those outputs being inverted relative to each other. In the example of FIG. 1, the collectors of the transistors 3 and 5 form an output A and the collectors of the transistors 4 and 6 form an output $\overline{A}$ of the master flip-flop.

The slave portion of the divider stage is fundamentally designed in the same manner, however, the clock sequences for the input stage are reversed, that is, the non-inverted clock sequence is supplied to the base terminal of transistor 1b and the inverted clock sequence $\overline{T}$ is supplied to the base terminal of the transistor 2b. The emitters of transistors 9 and 10, forming a differential amplifier, are connected to the collector of transistor 1b, and the emitters of transistors 7 and 8, forming another differential amplifier, are connected to the collector of transistor 2b. The base of the transistor 9 is connected to a collector pair formed by the collectors of transistors 8 and 10, and the base of the transistor 10 is connected to a collector pair formed by the collectors of the transistors 7 and 9. Each collector pair is connected through a respective load resistor R to the supply voltage $V_{cc}$. The common node of the collectors of the transistors 8 and 10 forms the non-inverted output B of the slave flip-flip, and the common node of the collectors of the transistors 7 and 9 forms the inverted output $\overline{B}$ of the slave flip-flop. The base terminals of the two transistors 7 and 8 forming the differential amplifier which is controlled by the inverted clock sequence $\overline{T}$ form the inputs of the slave flip-flop, which are controlled by the two outputs A and $\overline{A}$ of the master flip-flop. The base of the transistor 7 is connected to the inverting output $\overline{A}$, and the base of the transistor 8 is connected to the non-inverting output A. As a feedback path from the slave flip-flop to the master flip-flop, the collectors of the transistors 8 and 10, that is, the output B, is connected to the base of the transistor 4 and the collectors of the transistors 7 and 9, that is, the output $\overline{B}$, is connected to the base of the transistor 3.

Figure 2:
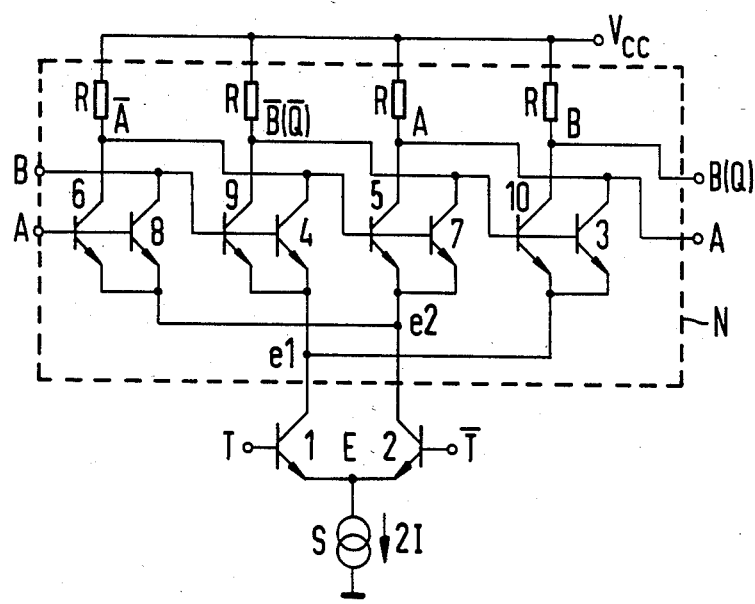
FIG. 2 is a circuit diagram of a modified divider (or counter) stage of the type shown in FIG. 1 having a single input stage.

As shown in FIG. 2, the two input stages Em and Es may be combined into a single input stage E which is connected to a constant current source S which supplies twice the current to I in comparison to the current I supplied by each of the current sources S1 and S2 (assuming the load resistors R and the transistors 3 through 10 of the circuit shown in FIG. 1 are the same as in FIG. 2, and the transistors 1 and 2 of the input stage E correspond to the transistors 1a, 1b, 2a and 2b of the stages Em and Es). The connection of the transistors 4, 6, 8 and 9 controlled by the clock sequence T and the transistors 3, 5, 7 and 10 controlled by the clock sequence $\overline{T}$ is derived in the same manner explained in connection with FIG. 1.

The transistors 3 through 10 and the four load resistors R form a network N which is connected through the load resistors R to the supply voltage $V_{cc}$ and which has a first input e1 (formed by the common connection of the emitters of the transistors 4, 9, 3 and 10) connected to the collector of the transistor 1 controlled by the clock sequence T, and which has a second input e2 (formed by the common emitters of the transistors 5, 6, 7 and 8) connected to the collector of the transistor 2 controlled by the inverted clock sequence $\overline{T}$. Each of the master-slave flip-flop cells of FIG. 1 and FIG. 2 represents a 1:2 divider or a binary counter stage.

If, for example, one wishes to use the master-slave flip-flop cell shown in FIG. 2 to produce a two-stage divider, that is, a 1:4 divider, in the known manner, the two outputs B and $\overline{B}$ of the slave flip-flop of a first divider stage (these outputs then being references Q and $\overline{Q}$) are connected to the inputs of a second identically constructed divider stage, those inputs being the base terminals for the transistors in the input stage of the second stage, corresponding to the transistors 1 and 2. This requires, however, an intervening level shifter unit, as shown in FIG. 3.

Figure 3:
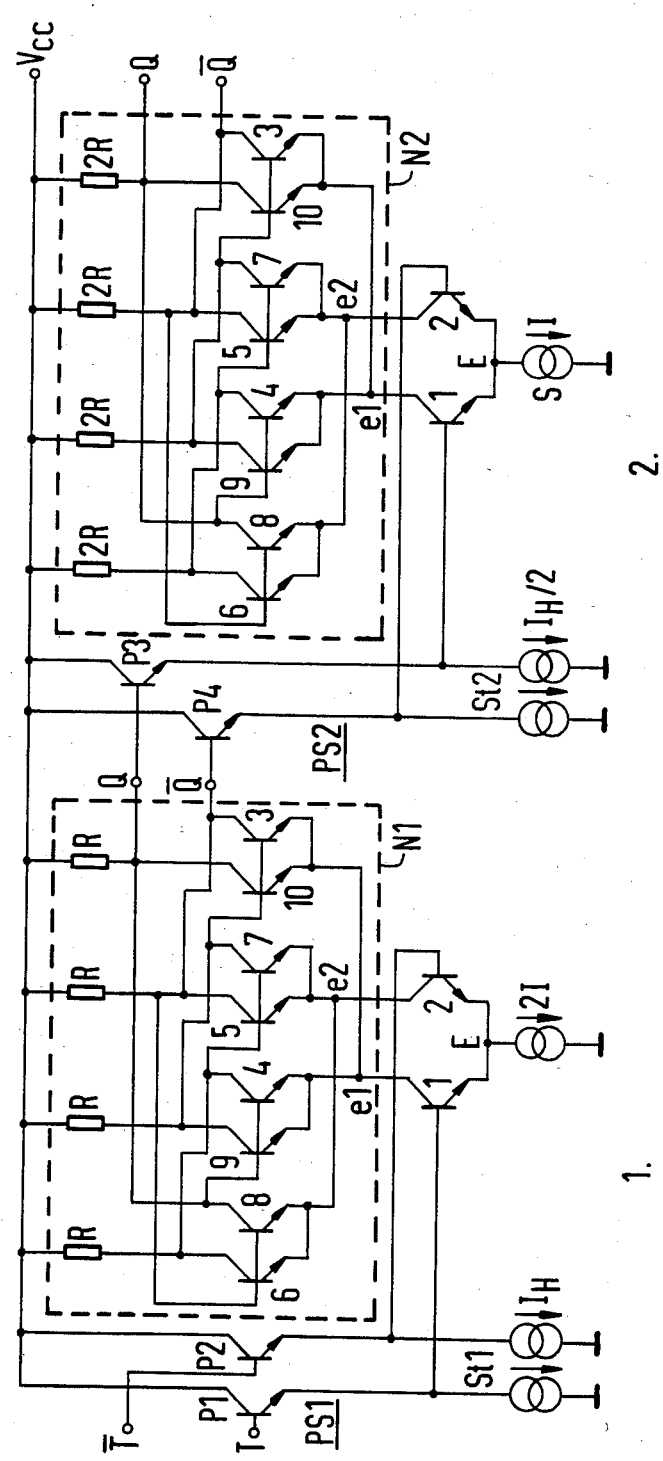
FIG. 3 is a circuit diagram for a two-stage frequency divider utilizing two master-slave flip-flop cells of the type shown in FIG. 2.

As may be seen in FIG. 3, the Q output of the first master-slave flip-flop, having a divider network referenced N1, is connected to the base of a level shifter transistor P3 which is operated in a common collector circuit and therefore has a collector connected to the supply potential $V_{cc}$. (As already pointed out, the Q (or B) output is formed by the collectors of the transistors 8 and 10 in the slave flip-flop.) The $\overline{Q}$ output (or $\overline{B}$ output) of the first master-slave flip-flop (which is formed by the collectors of the transistors 7 and 9 in the slave flip-flop) is similarly connected to the base of a second level shifter transistor P4, which has a collector also connected to the supply voltage $V_{cc}$. Both level shifter transistors P3 and P4 are connected to the outputs of a constant current source St2, which is connected to the reference potential (ground). The two level shifter transistors P3 and P4 and the current source St2 form a level shifter unit PS2 which operates on the inputs of the input stage E of the second frequency divider stage, the transistor P3 controlled by the output of the first stage having its emitter connected to the base of the transistor 1 (thus supplying the clock sequence T for the second stage) and the transistor P4 controlled by the $\overline{Q}$ of the first stage has an emitter connected to the base of the transistor 2 (thus supplying the clock sequence $\overline{T}$ for the second stage). The transistor/resistor network of the second divider stage is references N2, and the transistor/resistor network for the first divider stage is referenced N1. In order to reduce power dissipation, it is preferable to binarily weight the load resistors in the successive stages, so that the network N2 of the second stage in the illustrated example has load resistors having twice the value of the resistance of the load resistors for the network N1 of the first divider stage. The resistors in the network N2 are accordingly references 2R. Such weighting is not absolutely necessary, however, and may under certain conditions be omitted.

The pulses provided at the bases of the transistors 1 and 2 of the input stage E for the first divider stage are also operated upon by a level shifter unit, this being designated PS1. The level shifter unit PS1 includes transistors P1 and P2 having respective emitters connected to a voltage source St1, which is connected to the reference potential (ground). The level shifter transistors P1 and P2 have respective collectors directly connected to the supply voltage $V_{cc}$. The level shifter transistor P1, controlled by the clock sequence T to be processed, has an emitter connected to the base of the transistor 1 of the first stage input stage E, and the level shifter transistor P2, controlled by the clock sequence $\overline{T}$, has an emitter connected to the base of the transistor 2 of the input stage E for the first divider stage.

As shown in FIG. 3, the current sources comprising the source St1 for the level shifter unit PS1 both supply a current $I_H$, and the two current sources comprising the current source St2 for the second level shifter unit PS2 each supply one-half of this current, $I_H/2$, to the transistors P3 and P4. If a third divider stage were provided, the inputs thereof would be controlled in the same manner by the outputs Q and $\overline{Q}$ of the second divider stage, with another level shifter unit connecting the two outputs of the second stage to the input stage for the third stage, with the level shifter transistors between the second and third stages being supplied with a current $I_H/4$. Such decreasing weighting of the current supply to the successive level shifter transistors results in a reduction in the power dissipation for the overall circuit, as does the weighting of the load resistors in the network of the successive divider stages. This also results, however, in a retardation of the individual stages in comparison to the preceding stages, however this is not a disadvantage in view of the frequency to be respectively processed by a particular stage. The four load resistors of a third divider stage would have a resistance value 4R in accordance with this approach.

Figure 4:
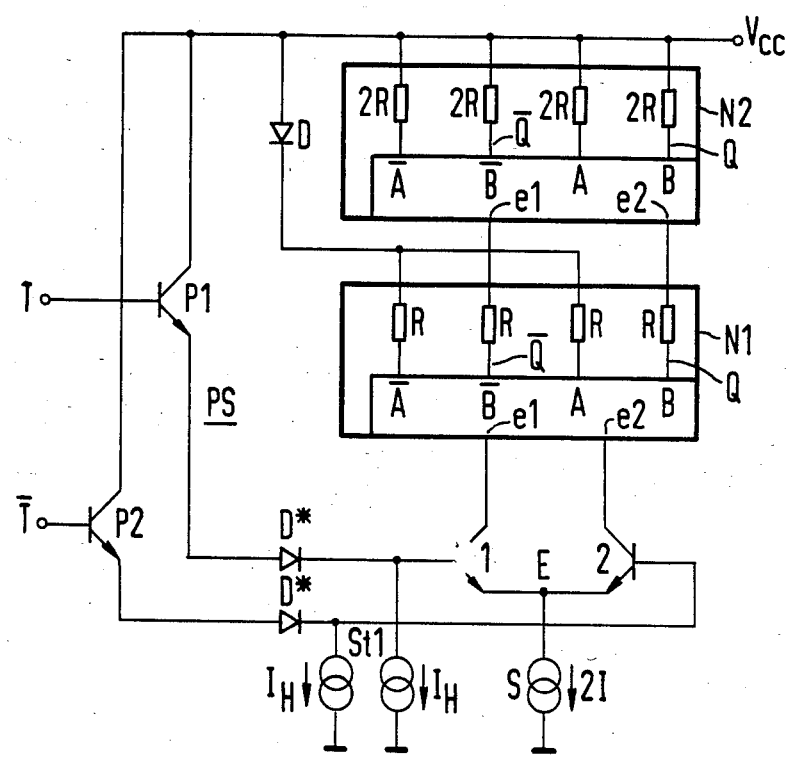
FIG. 4 is a block diagram of a two-stage frequency divider constructed in accordance with the principles of the present invention.
Figure 5:
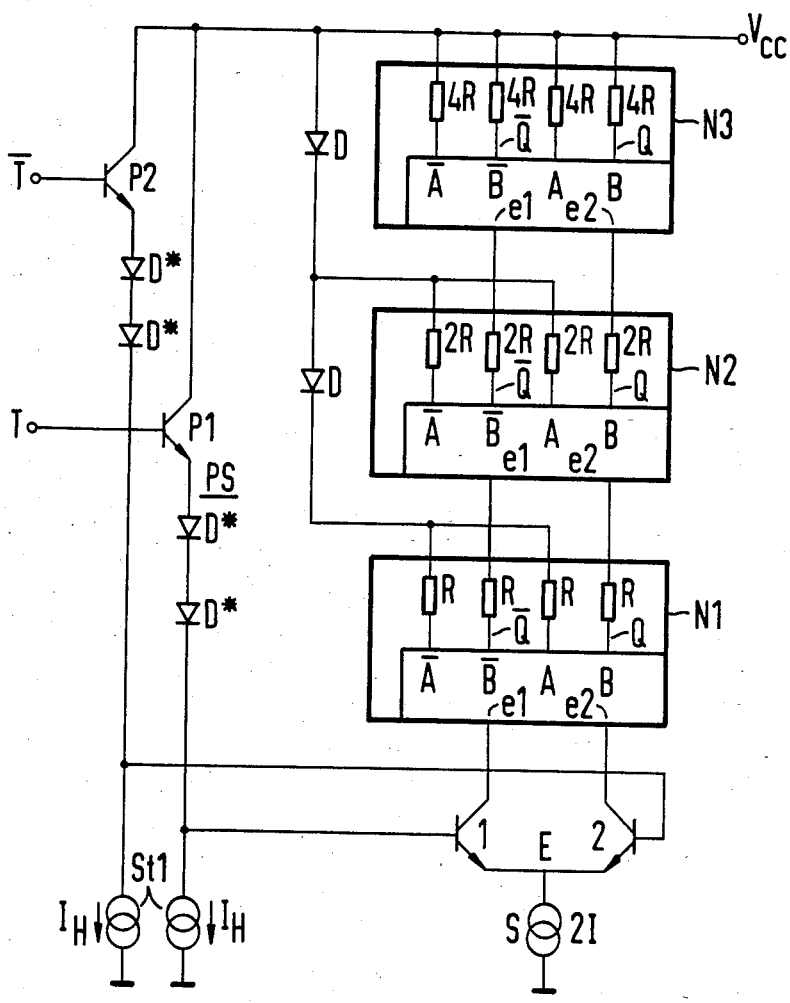
FIG. 5 is a block diagram of a three-stage frequency divider constructed in accordance with the principles of the present invention.

In contrast thereto, a two-stage frequency divider constructed in accordance with the principles of the present invention is shown in FIG. 4, and a three-stage divider constructed in accordance with the principles of the present invention is shown in FIG. 5, wherein only one level shifter unit, allocated to the input stage, is employed, with the second and further stages operating without such a level shifter. As described in detail below, in order to match the single input level shifter PS in the inventive circuit to the number of divider stages which follow, a number of diodes D* are provided in the emitter branches of the two level shifter transistors P1 and P2.

The two-stage frequency divider shown in FIG. 4 has an input stage E supplied with a current 2I by a constant current source S, this input stage being constructed in the same manner as that shown in FIGS. 2 and 3 by two transistors 1 and 2 forming an emitter-coupled differential amplifier. The transistor 1, controlled by the clock sequence T to be evaluated, is supplied to the input e1 of the first network N1 formed by the emitters of the transistors 3, 4, 9 and 10. The transistor 2 of the input stage E, which is controlled by the inverted clock sequence $\overline{T}$, has a collector connected to the input e2 of the second network N2, formed by the emitters of the transistors 5, 6, 7 and 8. (In FIGS. 4 and 5, the transistors 3 through 10 provided in the individual networks are for simplicity shown as a block, with the outputs A, $\overline{A}$, B, $\overline{B}$, Q and $\overline{Q}$ associated with the master flip-flop and the slave flip-flop, and the two inputs e1 and e2, being indicated. The load resistors respectively associated with the four outputs are shown in FIGS. 4 and 5 and provided with a designation R or 2R, in order to indicate the respective weighting.)

The clock sequence T (or $\overline{T}$) to be divided is supplied either directly or, as shown in FIGS. 4 and 5, through a level shifter unit to the input stage E. The level shifter PS consists of a transistor P1, having a base supplied with the sequence T, and having an emitter connected to the anode of a diode D* connected to the base of the transistor 1 of the input stage E. Similarly, the level shifter transistor P2 has a base which is supplied with the inverted clock sequence $\overline{T}$, and has an emitter connected to the anode of another diode D*, which has a cathode connected to the base of the transistor 2 of the input stage E. Additionally, the respective bases of the transistors 1 and 2 are supplied with a current $I_h$ from a constant current source St1, as was also the case for the first stage in the circuit shown in FIG. 3.

The improvement achieved by the invention disclosed and claimed herein is that the first network N1 forming the first divider stage has an output B (or Q) which is utilized to control the network N2 forming the second stage, such control occurring through connection of the load resistor R of the first network N1 to the input e1 of the second network N2. In a similar manner, the output $\overline{B}$ (or $\overline{Q}$) of the slave flip-flop of the first stage is connected through the load resistor R to the input e2 of the second network N2. The two outputs A and $\overline{A}$ of the master flip-flop of the first network N1 are connected through a load resistor R to the cathode of a diode D, which has an anode directly connected to the supply potential $V_{cc}$.

The four outputs A, $\overline{A}$, B and $\overline{B}$ of the second network N2 forming the second divider stage are connected to the supply potential $V_{cc}$ through respective load resistors 2R. The two outputs B and $\overline{B}$ of the slave flip-flop in both network N1 and N2 form the outputs Q and $\overline{Q}$ for those stages. The collectors of the two level shifter transistors P1 and P2 are directly connected to the supply voltage $V_{cc}$. The four load resistors in the first network N1 have a resistance value R, the four resistors in the second divider stage (that is, the second network N2) have a value 2R, and, as shown in FIG. 5, if a third stage is provided the resistors in a third network N3 forming the third divider stage have a value 4R. This corresponds to the weighting discussed in connection with FIG. 3.

Both stages of the circuit shown in FIG. 4 divide the input frequency T or $\overline{T}$ by four so that a clock sequence T/4 or $\overline{T}$/4 is supplied to the respective outputs Q and $\overline{Q}$ of the network N2. Each stage consumes voltage corresponding to a diode, thus each network is bridged by a diode D for matching. If the input stage E, functioning as a current switch, and the current source S are taken into consideration, up to three stages can be connected in series given a 5 V supply voltage, as shown in FIG. 5. This achieves a 1:8 divider.

In the three-stage divider embodiment shown in FIG. 5, connection of the second stage N2 to the first stage N1 corresponds to that shown in FIG. 4. The load resistors of the second stage N2, however, are not connected to the supply voltage $V_{cc}$ as in FIG. 4, but are instead connected to the input e1 and e2 of the third stage N3 in a manner corresponding to the outputs of the network N1. Only the load resistors of the third network N3 are connected to the supply voltage $V_{cc}$, these resistors having a resistance 4R. The load resistors 2R of the second stage, that is, of the network N2, are connected in the same manner as those of the network N1 in FIG. 4. This means that the outputs A and $\overline{A}$ of the second network N2 are connected in common through a load resistor 2R to the cathode of the diode D which bridges the network N3, the anode thereof being connected to the supply voltage $V_{cc}$. The slave flip-flop output B of the network N2 is connected through a load resistor 2R to the input e1 of the network N3 forming the third divider stage, and the slave flip-flop output $\overline{B}$ is connected to the input e2 thereof. The diode which bridges the network N2 has a cathode connected through respective load resistors R to the two outputs A and $\overline{A}$ of the first divider stage network N1 has an anode connected to the two outputs A and $\overline{A}$ of the master flip-flop of the second network N1 through load resistors 2R. The two diodes D in the three-stage embodiment of FIG. 5 thus form a series connection. In order to compensate for the higher voltage drop in the circuit shown in FIG. 5 in comparison to the circuit shown in FIG. 4, the level shifter PS includes two further diodes D* respectively connected in the emitter branches of the circuits for the transistors P1 and P2.

Any number n of network of the type described above which are controlled by a common input stage E may thus be connected in series for achieving a $1:(2^n+1)$ divider. The supply voltage, however, must be matched to the number of series connected networks in the manner described above. Any such multi-stage divider constructed on the basis of FIGS. 4 and 5 will, however, have the following common features. The last stage, that is, the network Nn has all of its load resistors connected directly to the supply potential. Secondly, with the exception of the network N1 controlled by the input stage E, all subsequent networks have an input e1 connected to the Q output (B) of the immediately preceding stage through a load resistor associated with that preceding stage, and will similarly have and input e2 connected through a load resistor of the preceding network to the $\overline{Q}$ output ($\overline{B}$) thereof. Thirdly, the load resistors for the various networks will be binarily weighted such that the $p^{th}$ network (that is, the network Np) will have four load resistors with the value $2^p \times R$ (assuming the basic value of the load resistors in the first network N1 is R). Fourthly, each of the networks Np provided in the chain has a diode which bridges the network having a cathode connected to the two outputs A and $\overline{A}$ of the master flip-flop of the preceding network N(p−1) through a load resistor of that preceding network (that is, a load resistor having the value $2^{(p-1)} \times R$) and having an anode connected to the outputs A and $\overline{A}$ of the master flip-flop of the network Np through respective load resistors associated therewith (that is, having a value $2^p \times R$). Lastly, the respective emitters of the two level shifter transistors P1 and P2, which are connected to the respective bases of the transistors 1 and 2 of the input stage E as well as to the output of the current source St1, will be connected in series with (n−1) diodes D*.

As will be understood by those skilled in the art, the diodes D bridging the various networks may be replaced under given conditions by other components which exhibit a voltage drop corresponding to the voltage drop of the network, and which also exhibit a corresponding temperature response. For example, a second bridging network could be provided if one wished to derive additional phase-shifted divided clock sequences. In general, however, diodes are the preferred component, such diodes being realized by a transistor connected to operate as a diode.

Figure 6:
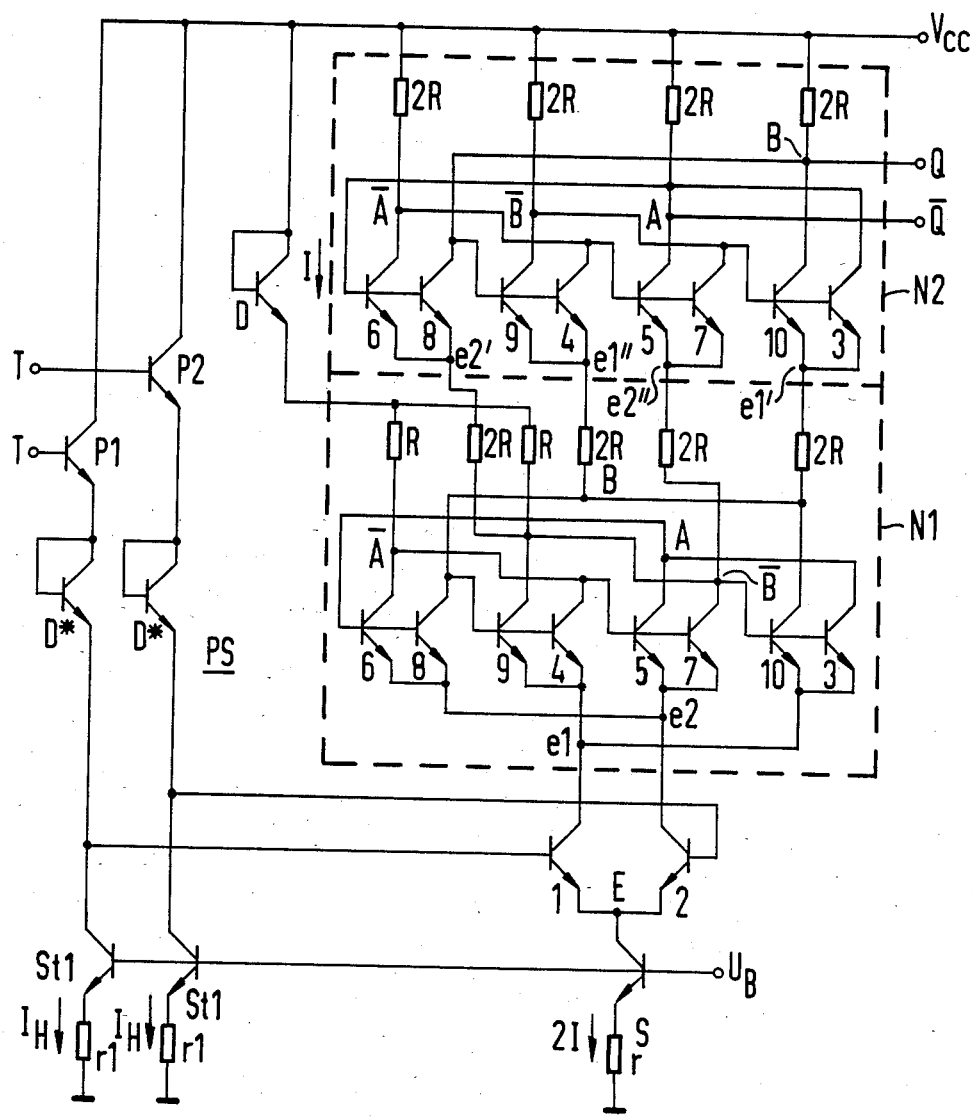
FIG. 6 is a circuit diagram of the two-stage divider shown in FIG. 4 constructed in accordance with the principles of the present invention.

Such is the case in the detailed circuit shown for a two-stage frequency divider in FIG. 6. The current source S for the input stage E and the current source St1 for the level shifter PS are also indicated by respective NPN transistors, connected through an emitter resistor r (or r1) to the reference potential (ground), the base terminals of the three current source transistors being driven by a common potential $u_B$ and the respective collectors functioning as the outputs of those current sources. The currents 2I (and $I_H$) are set by suitable dimensioning of the emitter resistors r and r1.

Although the drive of the first network N1 forming the first divider stage in the embodiment of FIG. 6 by the input stage E is the same as that shown in FIGS. 4 and 5, the master and slave flip-flops of the second divider stage N2 are separately driven by the first divider stage. As shown in FIG. 6, the input e1 for the second stage N2 is divided into an input e1' formed by the emitters of transistors 10 and 3, and an input e1" formed by the emitters of the transistors 4 and 9. The output B drives the inputs e1' and e1" through a resistor 2R. Similarly, the output e2 of the network N2 is divided into an input e2', formed by the emitters of the transistors 6 and 8, and an input e2" formed by the emitters of the transistors 5 and 7. The inputs e2' and e2" are driven by the output $\bar{B}$ through a load resistor 2R. In the embodiment of FIG. 6, therefore the network N1 has four load resistors 2R and two load resistors R. The two load resistors R function for connection of the master outputs A and $\bar{A}$ to the bridging diode D, which is formed by a transistor connected as a diode (as are the diodes D* in the level shifter PS). The splitting of the inputs e1 and e2 is not, however, generally required.

Figure 7:
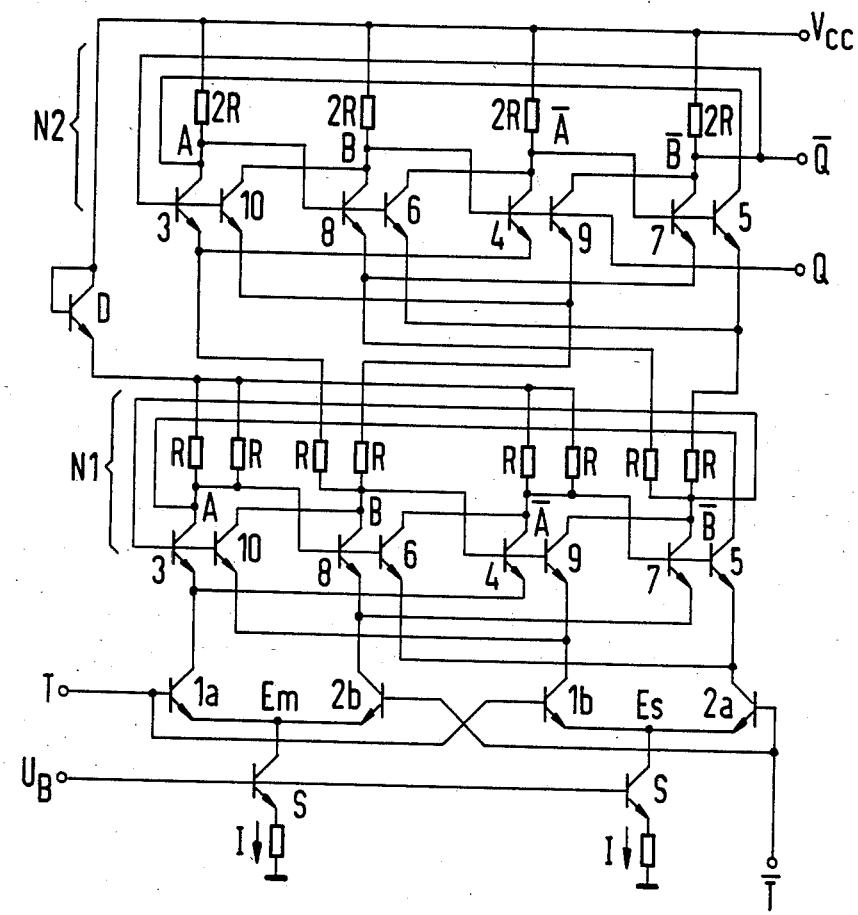
FIG. 7 is a circuit diagram for the two-stage divider having two input stages, one input stage for the slave portion of the first network, and another input stage for the master portion of the first network.

A two-stage divider is shown in detail in FIG. 7 wherein the input stage E is split into an input stage Em for controlling the master flip-flop and an input stage Es for controlling the slave flip-flop. Control of the transistors 3 through 10 in the network N1 for the first stage corresponds to that discussed in connection with FIG. 1, with the outputs B and $\bar{B}$ of the first network controlling the network N2 forming the second stage through load resistors R. The outputs A and $\bar{A}$ of the second stage are connected to the supply voltage $V_{cc}$ through load resistors 2R and through the bridging diode D. The supply voltage $V_{cc}$ is also directly connected to the collectors of the transistors 3 through 10 in the network N2 of the second divider stage. The clock pulse sequences T and $\bar{T}$ controlling the two input stages Em and Es may be provided with a level shifter PS of the type shown in FIG. 4 or FIG. 6.

Although the above discussion has described these circuits as frequency dividers, it will be apparent to those skilled in the art that the same circuitry can be utilized to construct a binary counter of the ripple-carry type.

Although modifications and changes may be suggested by those skilled in the art, it is the intention of the inventors to embody within the following claims all changes and modifications as reasonably and properly come within the scope of their contribution to the art.

We claim as our invention:

1. An integrable semiconductor circuit for a multi-stage frequency divider for use with a supply voltage and a constant current source comprising:

an input stage consisting of at least one differential amplifier connected to said constant current source and having control inputs to which respective input signals are supplied, and having at least two current outputs;

a first network forming a first divider stage consisting of a bistable circuit functioning as a master-slave flip-flop unit and having a master portion and a slave portion, said first network having first and second network inputs respectively connected to said current outputs of said input stage, said first network having two slave portion outputs and two master portion outputs;

a plurality of further networks forming successive divider stages each having a master portion and a slave portion the same as said first network, the respective first and second network inputs of each further network being connected to the slave outputs of the preceding network, said plurality of further networks including a last network having master outputs and slave outputs directly connected to said supply voltage; and a plurality of bridging circuit elements respectively connected in parallel across each of said further networks and connected in series to said supply voltage, each bridging circuit element having a voltage drop thereacross matched to the voltage drop across the network bridged by said bridging circuit element, each bridging circuit element having a first terminal connected to said master outputs of a network preceding the network bridged by said bridging circuit element and having a second terminal connected to the master outputs of the network bridged by said bridging circuit element.

2. A semiconductor circuit as claimed in claim 1 wherein each bridging circuit element is a diode and wherein said first terminal is the cathode of said diode, and wherein said second terminal is the anode of said diode.

3. An integrated semiconductor circuit as claimed in claim 1 wherein said first network and each of said further networks has a plurality of load resistors connected in series at each of said master outputs and said slave outputs, all load resistors within a network having the same value, and load resistors in successive networks being binarily weighted based on the value of the load resistors in said first network.

4. A semiconductor circuit as claimed in claim 1 wherein said input signals consist of a first input signal and a second input signal which is an inversion of said first input signal, and said semiconductor circuit further comprising:

a level shifter means having current outputs respectively connected to said control inputs of said input stage, said level shifter means having control inputs to which said first and second input signals are respectively supplied.

5. A semiconductor circuit as claimed in claim 4 wherein said level shifter means comprises:

a first level shifter transistor having a control input which is one of said control inputs for said level shifter means, a current output connected to said supply voltage, and a current input connected to one of said control inputs of said input stage and to a reference potential through a first additional constant current source;

a second level shifter transistor having a control input which is another of the control inputs of said level shifter means, a current output connected to said supply voltage, and a current input connected to another of the control inputs of said input stage and to a reference potential through a second additional constant current source identical to said first additional constant current source; and two sets of series-connected diodes respectively connected between said current outputs of said first and second level shifter transistors and said first and second additional constant current sources, each set of diodes consisting of a plurality of diodes equal in number to the plurality of further networks.

6. A semiconductor circuit as claimed in claim 5 wherein each of said diodes in said sets of diodes consists of a transistor having electrodes connected for operating as a diode.

7. An integrated semiconductor circuit as claimed in claim 1 wherein each of said bridging circuit elements consists of a transistor having electrodes connected for operating as a diode and wherein said first terminal is an effective cathode of said transistor connected for operating as a diode and wherein said second terminal is an effective anode of said transistor connected for operating as a diode.

8. A semiconductor circuit as claimed in claim 1 wherein said differential amplifier of said input stage consists of first and second transistors having respective current inputs connected to each other and to said constant current source, having respective control inputs forming said control inputs for said input stage, and having respective current outputs forming said current outputs of said input stage.

* * * * *